United States Patent [19]

Kreisel et al.

[11] Patent Number: 4,752,371

[45] Date of Patent: Jun. 21, 1988

[54] ELONGATED FRAME FOR RELEASABLY-HOLDING PRINTED CIRCUIT BOARDS

[75] Inventors: Rudolf Kreisel, Nürnberg; Dieter Pistor; Ludwig Mankut, both of Altdorf; Thomas Kosikowski, Nürnberg; Rolf Gaebel, Berlin; Peter Haase, Feucht; Peter Kuhn, Berlin, all of Fed. Rep. of Germany

[73] Assignee: Schering Aktiengesellschaft, Berlin and Bergkamen, Fed. Rep. of Germany

[21] Appl. No.: 23,132

[22] Filed: Mar. 2, 1987

[30] Foreign Application Priority Data

Feb. 28, 1986 [DE] Fed. Rep. of Germany ....... 3606492

[51] Int. Cl.$^4$ .............................................. C25D 17/06
[52] U.S. Cl. ............................................ 204/297 W
[58] Field of Search ........... 204/224 R, 297 R, 297 W

[56] References Cited

U.S. PATENT DOCUMENTS

| | | | |
|---|---|---|---|
| 3,429,786 | 2/1969 | Kubik | 204/297 W X |
| 3,824,176 | 7/1974 | Crowe | 204/297 R |
| 4,174,262 | 11/1979 | Van Mellaert et al. | 204/297 W X |
| 4,561,960 | 12/1985 | Jeannot et al. | 204/297 W |
| 4,595,480 | 6/1986 | Taklar et al. | 204/297 W |
| 4,605,483 | 8/1986 | Michaelson | 204/297 R X |

Primary Examiner—Donald R. Valentine
Attorney, Agent, or Firm—Michael J. Striker

[57] ABSTRACT

A device for releasably-holding printed circuit boards to be galvanized in a galvanization bath comprises an elongated frame, and arrangements for holding opposite longitudinal edges of the boards on the frame. The holding arrangements are electrically conductive. The frame includes two spaced paralled subframes. Each holding arrangement includes resilient clamping springs arranged on the subframes and freely extended outwardly from each subframe and also extending into a space between the subframes to enable an insertion into and a withdrawal from the clamping springs of respective elongated edges of each printed circuit board.

27 Claims, 8 Drawing Sheets

ELONGATED FRAME FOR RELEASABLY-HOLDING PRINTED CIRCUIT BOARDS

BACKGROUND OF THE INVENTION

The present invention relates to an elongated frame for releasably-supporting printed circuit boards to be galvanized.

Devices for holding printing circuit boards during the galvanization process in the galvanization bath have been known. One of such frames has been disclosed in DE-OS 31 16 897. The holding means in this conventional disclosure is formed by capstan-head screws which are pulled by hand and pressed against the edges of printed circuit boards. Such manual operations are bothersome. Since acid remainders could be found on such holding means the operator is required to wear protective gloves. Inasmuch as these holding elements should carry out not only the holding function but also should transmit galvanizing current to the printed circuit boards, a further disadvantage of conventional holding means resides in that current-transmitting contacts of the tips of the capstan-head screws are small relative to the plates being held. Thereby a very damaging voltage drop occurs at these spots of the current transmission. It should be noted that galvanizing baths operate with low voltage of GV.

SUMMARY OF INVENTION

It is an object of the present invention to provide an improved holding frame for supporting printed circuit boards to be galvanized in a galvanization bath.

It is another object of the invention to provide a simple holding means into which printed circuit boards to be galvanized can be easily inserted and from which these boards could be also easily removed.

Yet another object of the invention is to provide a holding frame which is particularly suitable for printed circuit boards with printed switches.

These and other objects of the invention are attained by a device for releasably-holding printed circuit boards to be galvanized in a galvanization bath, comprising an elongated frame; and means for holding opposite longitudinal edges of said boards, said holding means being electrically conductive, said frame including two spaced parallel subframes said holding means including resilient clamping means arranged on said subframes and freely extending outwardly from each subframe and also extending into a space between said subframes, said clamping means being formed so that an insertion into and a withdrawal from said clamping means of respective elongated edges of each printed circuit board are possible.

In the device according to the invention, printed circuit boards can be easily, and also mechanically, insertable into the clamping means and removable therefrom without any structural components obstructing these movements. The current transmission contacts of the clamping means to the printed circuit boards being galvanized can have sufficiently large surfaces.

If in the known device a number of capstan-head screws should be limited due to manual labor involved to fasten them, the number of resilient clamping means in this invention is not limited and in addition provides sufficiently large contact surfaces. The loading of the frame with printed circuit boards being galvanized can be also carried out by hand. A substantial simplification of operation, as compared to conventional frames of the foregoing type, can be however obtained because the insertion and removal of printed circuit boards into and from resilient clamping means are much less time-consuming than screwing and unscrewing of capstan-head screws. Moreover, sometimes such screws are not sufficiently tightened due to negligence of the operators. This disadvantage is avoided due to the present galvanizing process.

Each subframe may carry a plurality of resilient clamping holders spaced from each other, said holders being superposed one another in a direction of elongation of said frame, each holder having springs formed so that the insertion of elongated edges of each of said boards into said holders is possible in the direction of elongation of said frame between said springs.

The springs of each holder may form an insertion opening which is funnel-shaped and is enlarged towards the direction of insertion of a respective printed circuit board.

Each holder may include two cooperating clamping springs.

A hole may be provided in each subframe for each spring which has an end insertable into said hole to be held thereby, said end portion facing away from said insertion opening.

The subframes may be formed as elongated bars.

Each spring of each holder may have at each end thereof an outwardly bent portion, each bar having openings each receiving the bent portion of a respective spring so that said springs are held on each of said bars, the two springs of each holder being spaced from each other to form an insertion opening therebetween and both having convexities extending towards each other, said convexities engaging said printed circuit boards in a clamping position.

The convexities of said two cooperating springs may be offset relative to each other in a direction of elongation of said bar so that in said clamping position the convexities of said two springs do not overlap each other.

Said bent portions may be held in said openings with pre-stressing.

Each of said bars may be elongated in cross-section in a direction of elongation of a printed circuit board held between said two springs.

Said cross-section may be of rhombus and has a longer axis which extends in the direction of elongation of said printed circuit board.

Each of said boards may have at each elongated side edge thereof at least one opening in which a supporting element, provided on a respective bar, is engaged in a clamping position of said printed circuit board.

One of said springs may be S-shaped and has an S-shaped portion, the length of which is a little smaller than that of said opening of said board, and a straight portion insertable into said opening transversely to a plane of said printed circuit board.

One of said two springs may be probably supported on a respective bar between a clamping position and a release position.

Another of said two springs may be rigidly secured to a respective bar of the frame.

The device may further include two rotatable shafts, said one of said two springs being connected to one of said shafts to be pivoted thereby.

Each subframe may have a rod-shaped structure, said shafts being arranged at two opposite sides of said subframe whereby central axes of said shafts and a central axis of said subframe lie in a common plane.

Said shafts and said subframe may be in the clamping position in alignment with the printed circuit boards inserted into said springs.

The device may further include guiding plates spaced from each other along each subframe and connected thereto and two rotatable shafts connected to respective springs to pivot the latter, said guiding plates forming bearings for said rotatable shafts.

The guiding plates may each have abutments for supporting thereon said printed circuit boards, said abutments being electrically conductive.

The pivotable spring of each holder may be U-shaped and have a cross-piece and two legs connected to a respective shaft so that said cross-piece extends in the direction of elongation of said shaft and said legs in said clamping position press a respective printed circuit board against one of said abutments.

The device may include control means for controlling a mechanical actuation of said pivotable springs for the insertion and removal of said printed circuit boards.

The clamping springs may be made of flat tape.

Each subframe may be rod-like and formed of a core of copper and a sheathing of titanium.

The subframe may further have ribs extended outwardly of said sheating and formed of titanium, said ribs holding said springs.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawing.

BRIEF DESCRIPTION OF THE DRAWINGS

FIGS. 7 to 9 illustrate different views of unit Z of FIG. 6, wherein

DETAILED DESCRIPTION OF THE PREFERRED EMBODIMENTS

Figure 1:
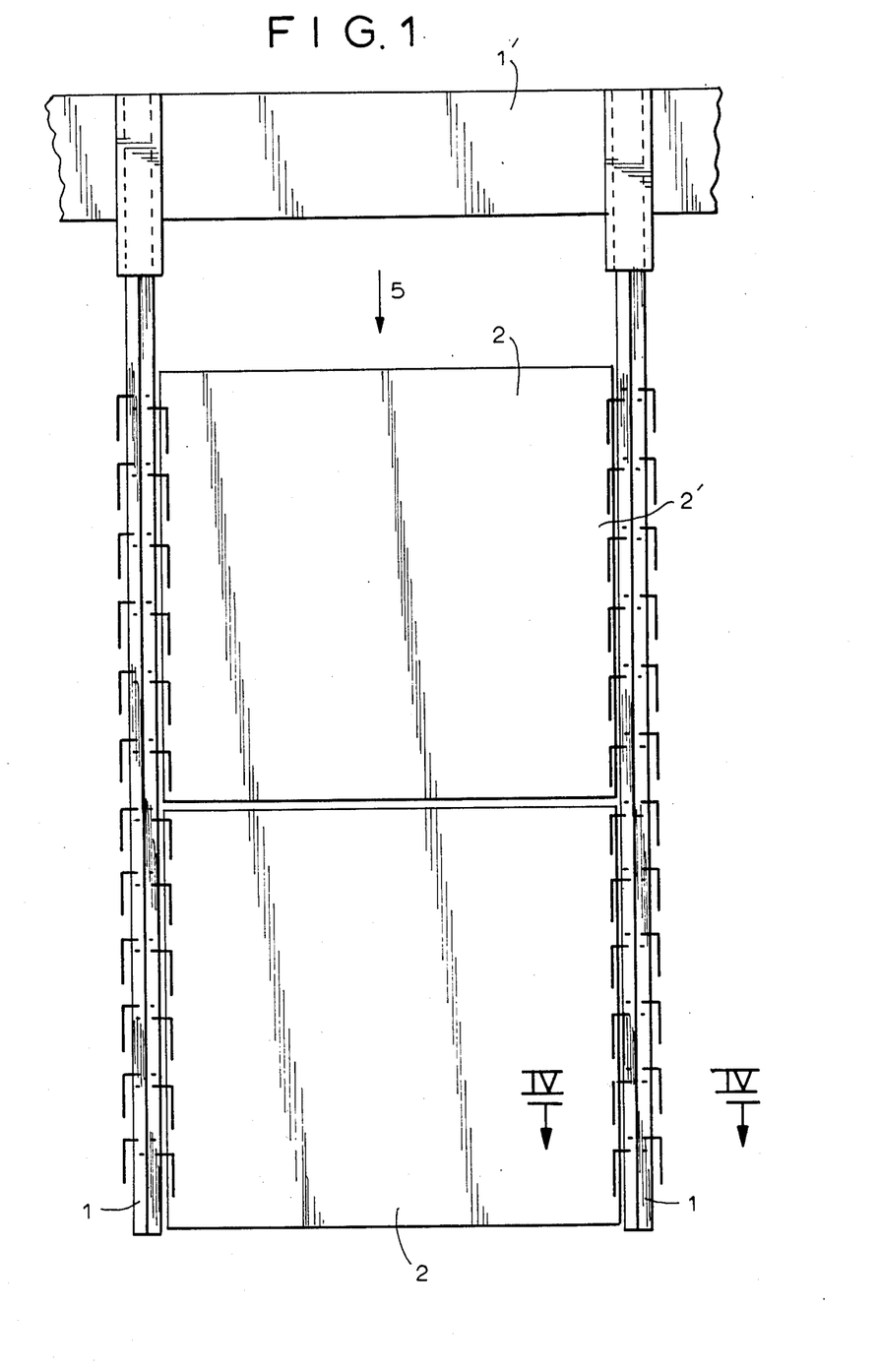
FIG. 1 is a schematic front view of the holding frame with two inserted printed circuit boards.

Referring now to the drawings in detail, and firstly to FIG. 1 thereof it will be seen that the frame is formed of two parallel elongated subframes which are in this embodiment bars 1 in which printed circuit boards 2 are held. In the embodiment shown in FIGS. 1 to 3, pairs of clamping springs 3 cooperating with one another are provided on the frame 1. Two opposite springs of each pair are slightly bent and hold the printed circuit board 2 inserted therebetween at place 4. The corresponding position of the printed circuit board pressed by springs 3 is shown in FIG. 3 by dash-dotted line. The shape of springs 3 is such that the printed circuit boards can be inserted between the opposite springs or pulled out of that inserted position, parallel to the direction of elongation of the frame 1, which is shown by arrows 5 and 6. Springs 3 have end portions 3' which are inserted in respective holes 7 and thus held therein. A galvanizing current is fed to printed circuit boards 2 via frame 1 and springs 3. This insertion of the printed circuit boards between the opposing springs is facilitated by funnel-shaped insertion openings 8 formed by those springs.

Figure 2:
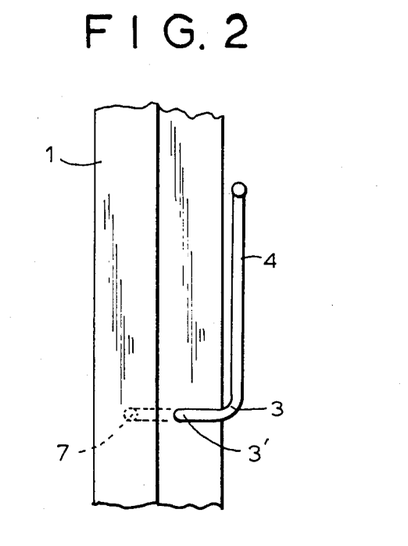
FIG. 2 is a side view and FIG. 3 is a plan view of the embodiment of FIG. 1, on enlarged scale.
Figure 3:
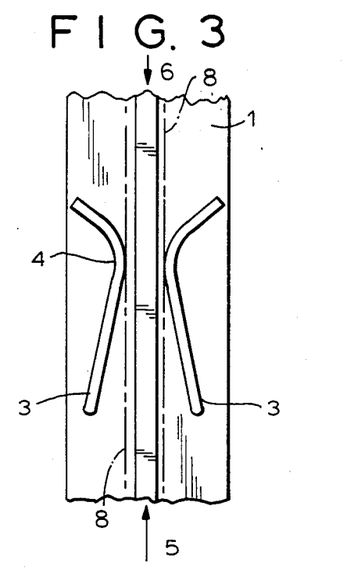

As particularly seen in FIGS. 1 and 2, springs 3 freely extend outwardly of the frame 1 so that the frame itself does not obstruct the insertion of the boards or plates 2 between springs 3. Respective springs preferably extend into the space between two bars 1 of the frame so that a uniform galvanizing is achieved.

FIG. 1 further shows that a number of printed circuit boards can be arranged in one frame and also a number of printed circuit boards 2 can be provided in the horizontal direction, because the frame bars can have at each side thereof a row of superposed pairs of the clamping springs.

The frame and the springs can be formed of titanium or stainless steel. These materials can be utilized for the springs of all the embodiments of the invention.

In place of two cooperating springs in each pair as disclosed above, only one spring with a rigid outer support can be provided; two cooperating springs have been suggested to increase a spring force acting on the printed circuit boards.

Figure 4:
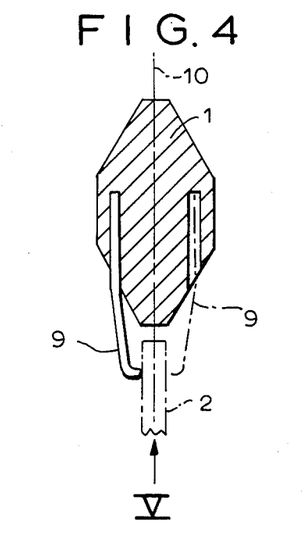
FIG. 4 shows another embodiment of the invention, in a sectional view taken along line IV—IV of FIG. 1.
Figure 5:
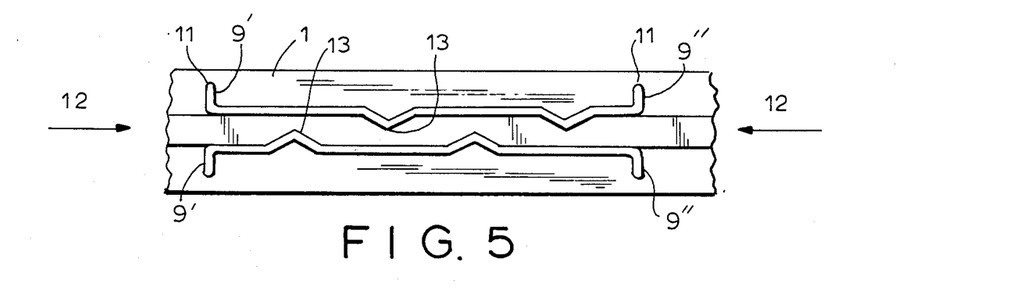
FIG. 5 is a view taken from arrow V of FIG. 4.

In the embodiment illustrated in FIGS. 4 and 5, the cross-section of each subframe 1 is shaped so that this cross-section is elongated in one direction and is of rhombic shape; for example, the axis of elongation 10 of this rhombic extends in the direction of springs 9. The printed circuit board 2 is shown in dash-dotted line and in this position it is held by springs 9. A relatively small screening of the galvanizing current flattened by a magnetic flux in reference to the printed circuit board 2 is thereby obtained. A greater screening which could be achieved with a square shape of each bar of the frame would result in that some material would be taken off the edges of the printed circuit boards. The reinforcement of the cross-section of the subframe 1 in the middle region serves to enhance mechanical rigidity and to improve current conductivity.

Springs 9 have in the embodiment of FIGS. 4, 5 bent end portions 9', 9" which are held in respective holes 11 of subframe 1 and, due to the prestressing of the springs, which acts in the direction of elongation of the springs, such means as welding for holding the springs in place are no longer necessary. FIG. 5 further shows a distance "a" between two opposite springs whereby the printed circuit boards are easily insertable at each side between the springs 9 in the direction of arrow 12. Springs 9 have at the internal sides thewreof convexities 13. The convexities 13 of the opposite springs face each other and are offset relative to each other in the direction of elongation of the springs 9; thus the printed circuit board 2 inserted between two opposite springs 9 is reliably held.

Figure 6:
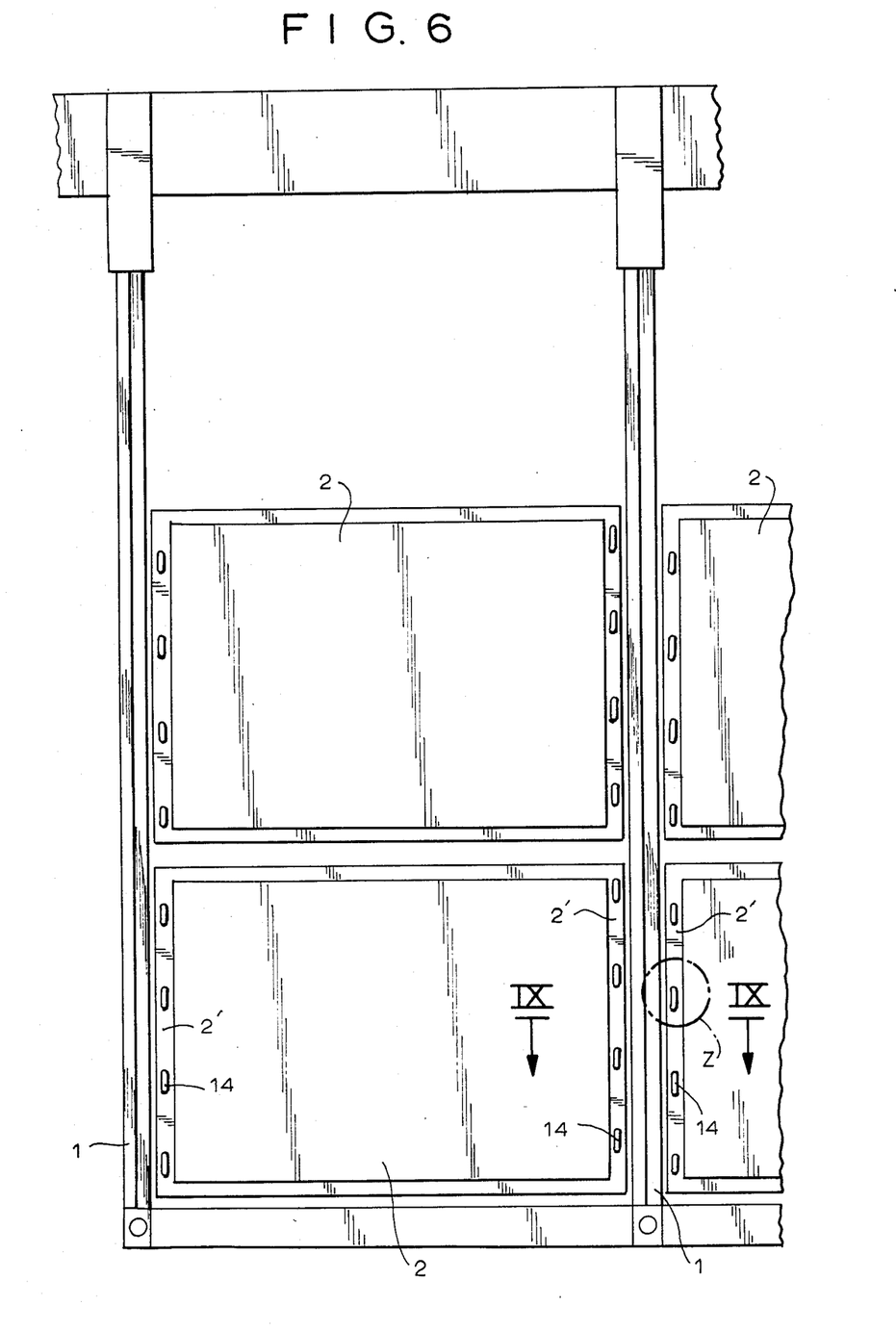
FIG. 6 is a front view of a further embodiment of the invention.

As shown in FIG. 6, the printed circuit boards 2 have at their longitudinal side edges 2' one or a plurality of openings which in the clamping position of the board 2 receive and engage respective support elemets of a respective frame bar 1 and thus additionally provide a clamping and secure position of the board 2 being galvanized. Additional holding means are shown in FIGS. 6–9 and 10–11.

Figure 7:
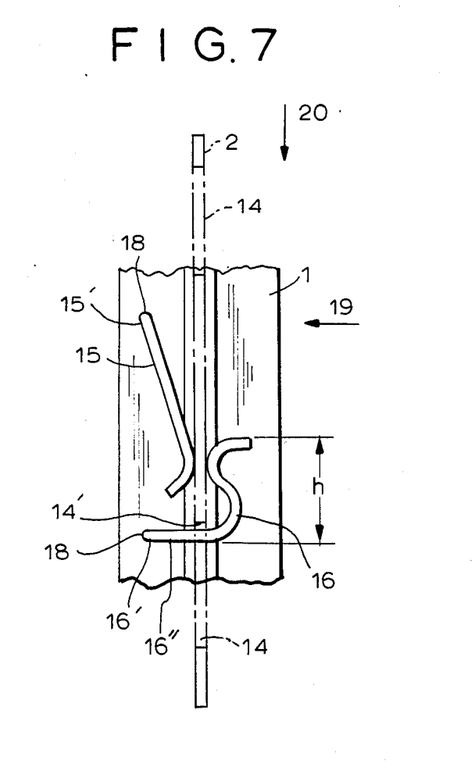
FIG. 7 is a view seen from arrow VII of FIG. 8.

In the embodiment of FIGS. 6–9, boards 2 are provided at their aforementioned elongated edges with rows of oblong openings 14. FIG. 6 also shows that bar 1 can hold the printed circuit board at each side thereof. Two clamping springs 15 and 16 cooperating with each other as shown in FIG. 7, are provided in each spring row in this embodiment. The S-shaped spring 16 performs the function of the aforementioned support element. Spring 16 has an end portion 16' which is held in an opening 11 of the bar 1 of the frame. Spring 15 has an end portion 15' which is also inserted into a respective opening or hole 16. The height "h" (FIG. 7) of the S-shaped portion of spring 16 is somewhat smaller than the length of opening 14. The S-shaped portion of the printed circuit board 2 is inserted into respective opening 14 in the direction of arrow 19 as seen in FIG. 7. Then this board is displaced some distance downwardly in the direction of arrow 20 until it takes the position shown in FIG. 7 by dash-dotted line, in which the upper edge 14' of this opening abuts against a portion 16" of spring 16.

Figure 8:
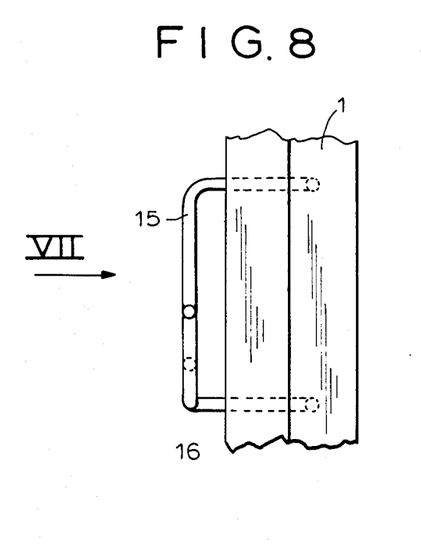
FIG. 8 is a view seen from arrow VIII of FIG. 9.
Figure 9:
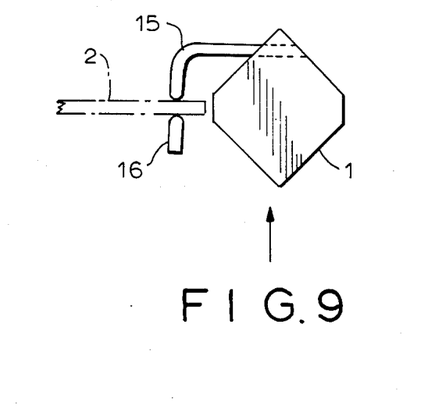
FIG. 9 is a sectional view on line IX—IX of FIG. 6.

FIG. 9 shows a section taken on line IX—IX of FIG. 6, however, in this embodiment the cross-section of each bar 1 of the frame has the shape as shown in FIG. 4. FIG. 8 is a front view of FIG. 9 as seen in the direction of arrow VIII of FIG. 9, and FIG. 7 is the view as seen in the direction of arrow VII of FIG. 8. Springs 15 and 16 also extend inwardly in the direction towards the opposite bar 1 of the frame.

Figure 10:
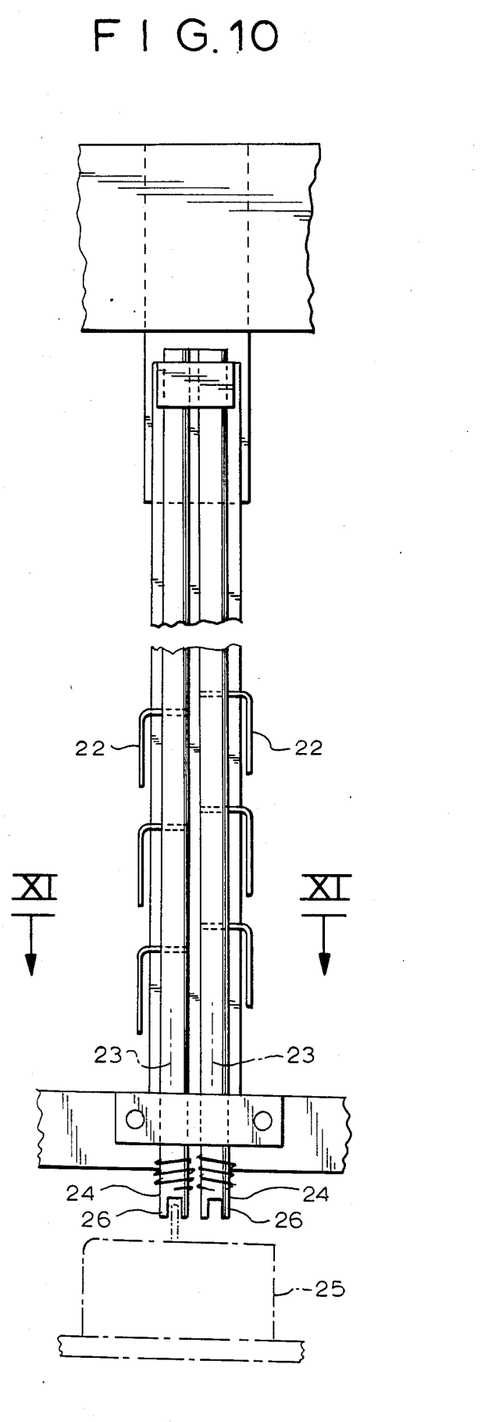
FIG. 10 is a front view of the frame of still another embodiment of the invention.
Figure 10A:
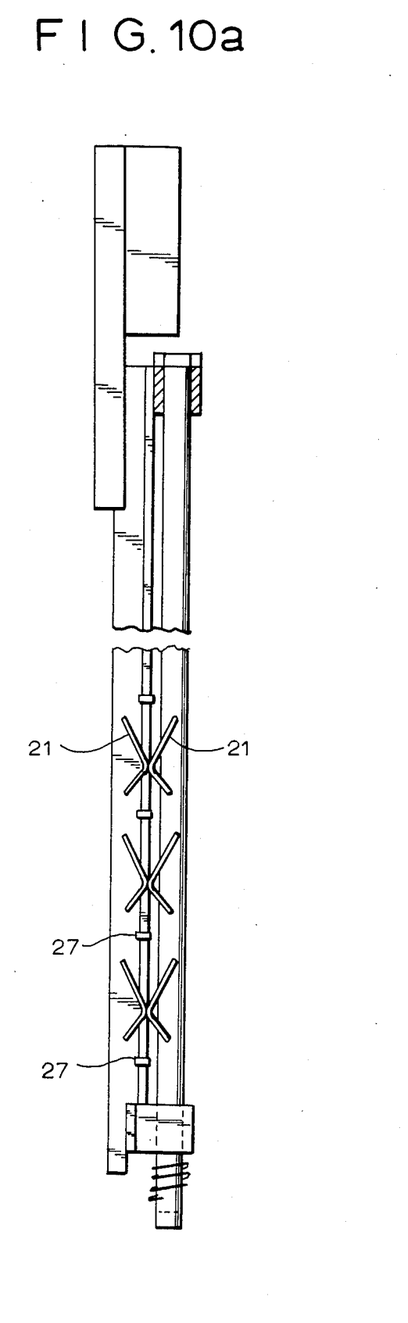
FIG. 10a is a side view of the frame of FIG. 10.
Figure 11:
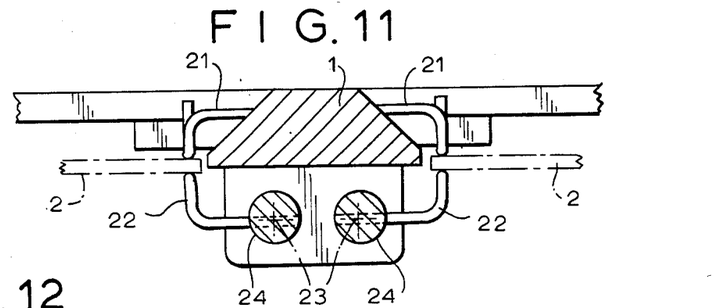
FIG. 11 is a sectional view taken along line XI—XI of FIG. 10.

In the embodiment depicted in FIGS. 10–11, spring pairs are provided, positioned on two parallel subframes of the frame. Each spring arrangement comprises a spring 21 rigidly secured on the frame bar 1 and a spring 22 which cooperates with the fixed spring 22 but is pivotable about a central axis 23 of a shaft 24 together with said shaft. FIG. 11 shows spring pairs 21, 22 in the clamping position. The printed circuit boards 2 shown in dash-dotted lines are in the position, in which the clamping springs abut on the surfaces of the printed circuit boards. By pivoting the left-hand shaft 24 (FIG. 11) in the counterclockwise direction and the right-hand shaft 24 in the clockwise direction springs 22 are moved from the clamping position and plates or boards 2 can be removed and replaced by new ones which are to be galvanized. By rotating the left-hand shaft 24 in the clockwise direction and the right-hand shaft 24 in the counterclockwise direction the clamping position of the springs 21, 22 will be again obtained. This embodiment of the invention is specifically suitable for an automatic insertion of the printed circuit boards into the clamping position as well as the automaic removal from the frame on which they are galvanized because the movement of printed circuit boards by mechanical means can be synchronously coupled with the rotation of shaft 24. With reference to FIG. 10, it will be seen that a rotation magnet 25 can impart a rotational motion to end portions 26 of shafts 24 so as to turn these shafts in the above described mode about their axes 23. By means of two meshed gears two paralled shafts 24 can be rotated in the opposite directions.

Further holding or supporting pins 27 are secured to the frame 1 in the embodiment of FIGS. 10, 11. Plates 2 are further secured in their operation or clamping position in which they are galvanized by means of pins 27 in non-shown holes. This plug-in connection ensures the position of plates 2 against falling rearwardly during the assembly stages in which springs 21, 22 do not clamp the plates 2.

In both embodiments, namely the embodiments shown in FIGS. 6–9 and 10 to 11, the printed circuit boards must be inserted between the clamping springs not in the direction of elongation from below or above but rather from the front side in the direction transversal to the plane of the printed circuit board. This is required when there is no free space available for the insertion of the printed circuit board from above or below. This is not only easier but also faster than the insertion in the longitudinal direction of the frame. The frame bars are formed so that a non-desired disadvantageous screening of the objects to be galvanized from the galvanizing current would not occur.

Figure 12:
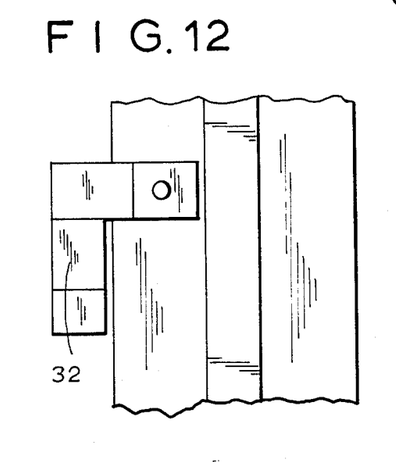
FIGS. 12 to 14 illustrate yet another embodiment of the clamping device of the invention.
Figure 13:
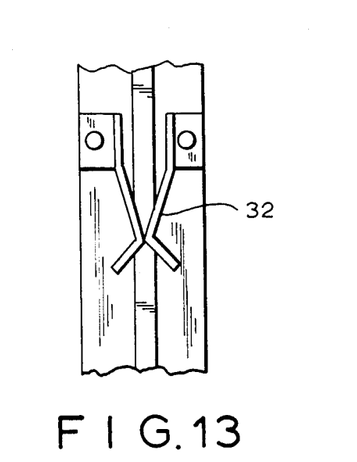
Figures 14, 15:
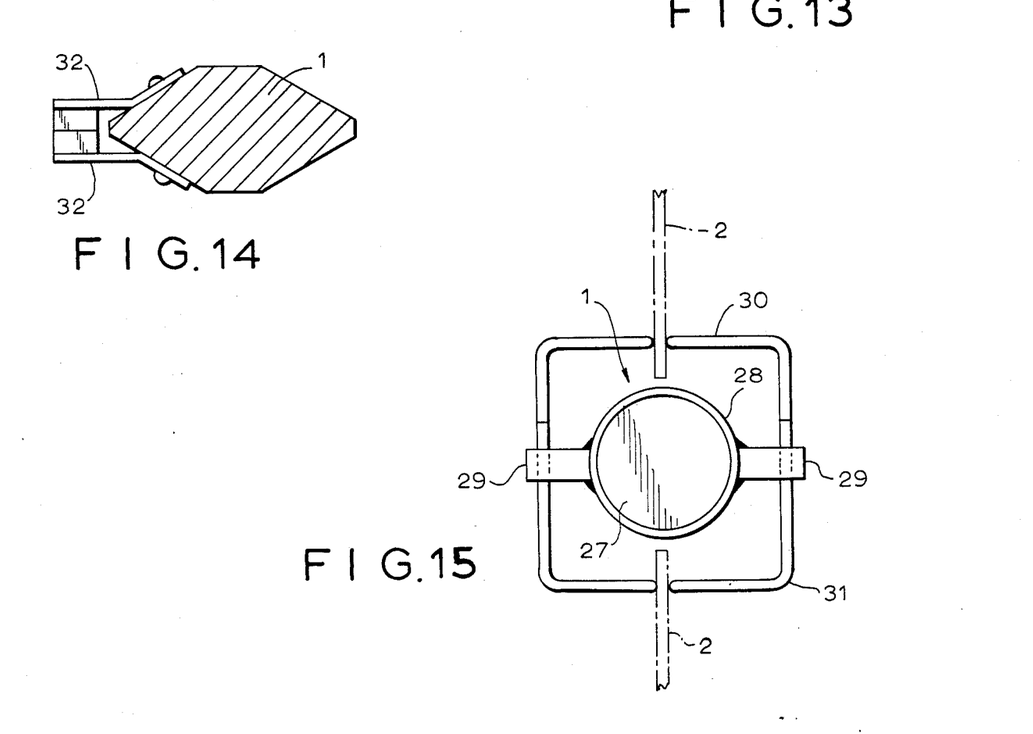
FIG. 15 is a plan view of the frame of still another embodiment of the invention.

In the embodiment shown in FIGS. 12–14, springs 32 are formed as leaf springs, that is they can be manufactured of a flat steel tape. This advantageously provides a linear contact between the springs and the plate to be clamped and therefore greater contact surfaces that in the case of the springs made of resilient round wire which provides only a point contact. Of course, any other suitable shapes of the springs are possible in this invention.

In the embodiment of FIG. 15, which is utilized in operation with high current densities for a fast depositing of galvanized layers, the respective frame bar 1 is formed of a copper core 27 with a sheating 28 of titanium. Supporting lugs 29, also of titanium, are provided for clamping springs 30, 31. The printed circuit boards are designated by reference numeral 2. In this embodiment damage to the clamping arrangement is prevented.

Figure 16:
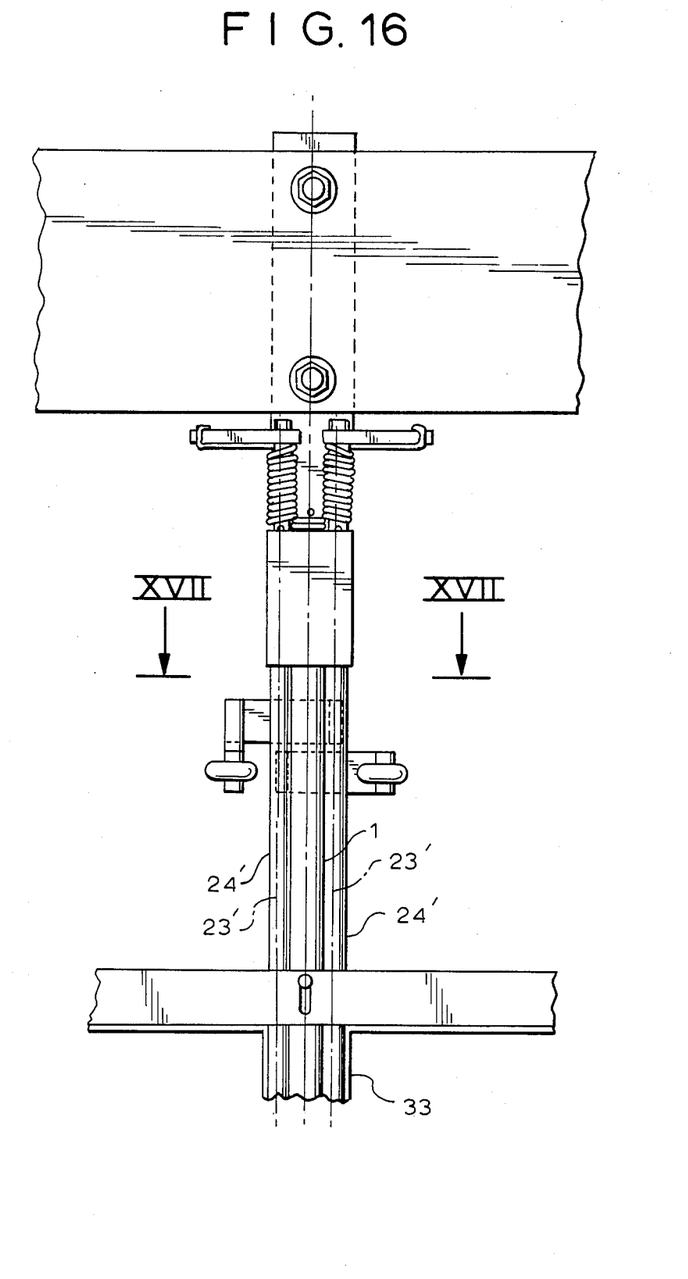
FIG. 16 is a front view of the frame similar to that of FIG. 10 but of a further embodiment of the invention.
Figure 17:
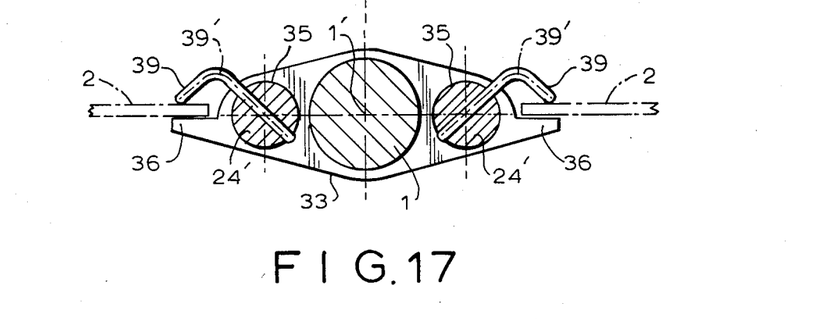
FIG. 17 is a sectional view taken on line XVII—XVII of FIG. 16.
Figure 18:
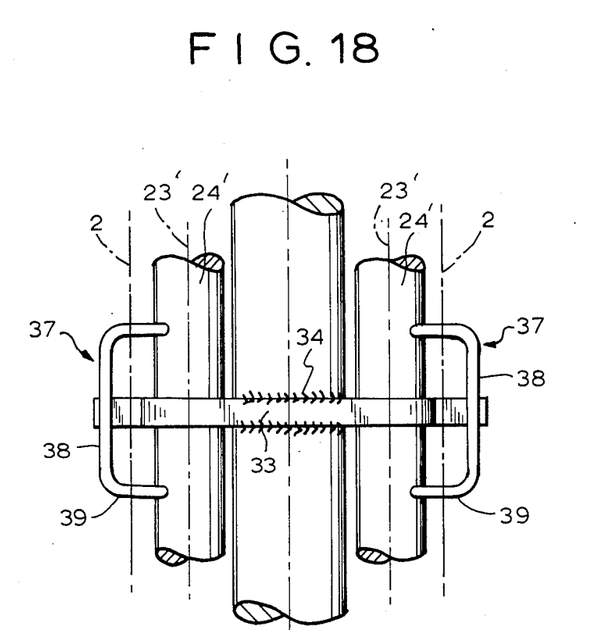
FIG. 18 is a front view of the frame of FIG. 16.

FIGS. 16 to 18 illustrate preferred embodiments of the frame with two pivotable shafts mentioned above. The most favorable field distribution,that is the distribution of current flows in the galvanizing bath, must be obtained, and therefore screening of the printed circuit boards during the galvanizing process by the frame and pivotable shafts should be avoided. For this purpose, pivotable shafts 24' are arranged at two opposite sides of the rod-shaped frame, so that central axes 23' of these shafts are in alignment with central axis 1' of the framel-,e.g. lie in the same plane with this axis (FIG. 17). The pivotable shafts 24' extend parallel to the frame 1.

As particularly seen in FIG. 17, plates or printed circuit boards 2 shown in dash-dotted lines, in their clamping position are in alignment with shafts 24' and frame 1. The holding of subframe 1 and shafts 24' together can be obtained in a simple manner by means of supporting and guiding plates 33. Subframe 1 extends through a bore in plate 3 and is rigidly secured thereto, for example, by weld seam 34. Pivotable shafts 24' are rotationally supported in bearings 35 formed by the bores in plate 33. Shafts 24' are however held in position in the axial direction. Depending on the length of frame 1, a respective number of spaced guiding plates 33 can be secured to frame 1.

The supporting and guiding plates 33 can be formed at the same time, electrically conductive due to their rigid connection with frame bars 1. Each guiding plate has abutments 36 for receiving plates 2 to be galvanized. The opposite pole of the current transmission is formed by clamping springs 37 which are U-shaped and have a cross-piece 38 and legs 39. The latter are fixed, at least against rotation, in the shafts 24', above and below the assigned supporting plate 33. Legs 39 are bent (FIG. 17) so that their end portions 39' are directed to the abutments 36 so as to clamp together with the same the printed circuit boards 2. Cross-pieces 38 of the springs extend approximately in the direction of elongation of shafts 24'.

It is clear that in all aforedescribed embodiments of the invention plates 2 can be held on the frame of this invention in the galvanizing bath. As shown, for example in FIG. 1, bars 1 can be connected to each other by a frame support 1a.

The frame can, after the galvanization has been completed, be cleaned in an acid bath (stripped). The frame, namely its structural components, can be easily insulated with a non-conductive acid-resistant coating so that undesired galvanic sediments remain undone. The contact points of the springs remain exposed. The stripping or purifying in the acid bath is then limited to these contacts.

It will be understood that each of the elements described above, or two or more together, may also find a useful application in other types of elongated frames for releasably-holding printed circuit boards to be galvanized differing from the types described above.

While the invention has been illustrated and described as embodied in an elongated frame for releasably-holding printed circuit boards to be galvanized, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims.

1. A device for releasably-holding printed circuit boards to be galvanized in a galvanization bath, comprising an elongated frame; and means for holding opposite longitudinal edges of said boards, said holding means being electrically conductive, said frame including two spaced parallel subframes, said holding means including resilient clamping means arranged on said subframes and freely extending outwardly from each subframe and also extending into a space between said subframes, said clamping means being formed so that an insertion into and a withdrawal from said clamping means of respective elongated edges of each printed circuit board are possible, each subframe carrying a plurality of resilient clamping holders spaced from each other, said holders superposing one another in a direction of elongation of said frame, each holder having springs formed so that the insertion of the elongated edges of each of said boards into said holders is possible in the direction of elongation of said frame between said springs.

2. The device as defined in claim 1, wherein said springs of each holder form an insertion opening (8) which is funnel-shaped and is enlarged towards the direction of insertion of a respective printed circuit board.

3. The device as defined in claim 2, wherein a hole (7, 18) is provided in each subframe for each spring which has an end portion (3', 15', 16') insertable into said hole to be held thereby, said end portion facing away from said insertion opening.

4. The device as defined in claim 1, wherein each holder includes two cooperating clamping springs.

5. The device as defined in claim 4, wherein said subframes are elongated bars.

6. The device as defined in claim 5, wherein each spring (9) of each holder having at each end thereof an outwardly bent portion (9'), each bar having openings (11) each receiving the bent portion of a respective spring so that said springs are held on each of said bars, the two springs of each holder being spaced from each other to form an insertion opening therebetween and both having convexities (13) extending towards each other, said convexities engaging said printed circuit boards in a clamping position.

7. The device as defined in claim 6, wherein the convexities of said two cooperating springs are offset relative to each other in a direction of elongation of said bar so that in said clamping position the convexities of said two springs do not overlap each other.

8. The device as defined in claim 6, wherein said bent portions (9') are held in said openings (11) with pre-stressing.

9. The device as defined in claim 5, wherein each of said bars is elongated in cross-section in a direction of elongation of a printed circuit board held between said two springs.

10. The device as defined in claim 9, wherein said cross-section is of rhombic and has a longer axis, which extends in the direction of elongation of said printed circuit board.

11. The device as defined in claim 5, wherein each of said plates has at each elongated side edge thereof at least one opening (14) in which a supporting element provided on a respective bar, is engaged in a clamping position of said printed circuit board.

12. The device as defined in claim 11, wherein said opening is oblong.

13. The device as defined in claim 12, wherein each of said holders serves as said supporting element.

14. The device as defined in claim 12, wherein one of said springs (16) is S-shaped and has an S-shaped portion the length of which is a little smaller than that of said opening of said board, and a straight portion insertable into said opening transversely to a plane of said printed circuit board.

15. The device as defined in claim 5, wherein one of said two springs (22) is pivotally supported on a respective bar between a clamping position and a release position.

16. The device as defined in claim 15, wherein another of said two springs (21) is rigidly secured to a respective bar.

17. The device as defined in claim 16; further including two rotatable shafts (24, 24'), said one of said two springs being connected to one of said shafts to be pivoted thereby.

18. The device as defined in claim 17, wherein said subframe is a rod-like structure and said rotatable shafts are arranged at two opposite sides of said subframe whereby central axes (23') of said shafts and a central axis (1') of said subframe lie in a common plane.

19. The device as defined in claim 17, wherein said shafts (24') and said subframe are in the clamping position in alignment with the printed circuit boards inserted into said springs.

20. The device as defined in claim 17, further including control means for controlling a mechanical actuation of said pivotable springs (22) for the insertion and removal of said printed circuit boards.

21. The device as defined in claim 4, wherein said clamping springs (32) are made of flat tape.

22. The device as defined in claim 4, wherein each subframe is rod-like and is formed of a core (27) of copper and a sheathing (28) of titanium.

23. The device as defined in claim 22, wherein said subframe further has lugs(29) extended outwardly of said sheathing and formed of titanium, said lugs holding said springs.

24. The device as defined in claim 1, further including guiding plates (33) spaced from each other along each subframe and connected thereto and two rotatable shafts connected to said springs to pivot the latter, said guiding plates forming bearings for said rotatable shafts (24').

25. The device as defined in claim 24, wherein said guiding plates each having abutments (36) for supporting thereon said printed circuit boards, said abutments being electrically conductive.

26. The device as defined in claim 25, wherein said pivotable spring (38) of each holder is U-shaped and has a cross-piece and two legs (39) connected to a respective shaft (24') so that said cross-piece (38) extends in the direction of elongation of said shaft and said legs in said clamping position press a respective printed circuit board against one of said abutments (36).

27. The device as defined in claim 26, wherein each of said legs is bent at an end portion (39') thereof in the direction of said abutment.

* * * * *